United States Patent [19]
Adschiri et al.

[11] Patent Number: 5,372,799
[45] Date of Patent: Dec. 13, 1994

[54] PROCESS FOR THE SYNTHESIS OF GRANULAR DIAMOND

[75] Inventors: Tadafumi Adschiri, Sendai; Junji Degawa, Itami; Takahiro Imai, Itami; Naoji Fujimori, Itami; Takehiko Furusawa, deceased, late of Tokyo, all of Japan, by Akiko Furusawa, administratrix

[73] Assignee: Sumitomo Electric Industries, Ltd., Osaka, Japan

[21] Appl. No.: 425,833

[22] Filed: Oct. 20, 1989

[30] Foreign Application Priority Data

Oct. 20, 1988 [JP] Japan .................. 63-264718

[51] Int. Cl.$^5$ .............. C01B 31/06; C23C 16/26; C23C 16/54
[52] U.S. Cl. .................. 423/446; 427/249; 117/929
[58] Field of Search .............. 423/446; 427/249, 213; 156/DIG. 68

[56] References Cited

U.S. PATENT DOCUMENTS 4,416,913 11/1983 Ingle et al. ............... 423/350
4,859,493 8/1989 Lemelson ................. 423/446

FOREIGN PATENT DOCUMENTS 0286310 10/1988 European Pat. Off.
135117 8/1983 Japan.
231498 10/1985 Japan.

OTHER PUBLICATIONS

*Perry's Chemical Engineer's Handbook*, 4th Ed., McGraw Hill Book Co., Inc., 1963, pp. 5–59.
Patent Abstracts of Japan, vol. 8, No. 260 (C-254)[1697], 29th Nov. 1984; & JP-A-59 137 311 (Kagakugijutsucho Zaishitsu Kenkyusho (Japan)) Jul. 08, 1984 *Abstract*.

Primary Examiner—Michael Lewis
Assistant Examiner—Stephen G. Kalinchak
Attorney, Agent, or Firm—Wenderoth, Lind & Ponack

[57] ABSTRACT

Granular diamond suitable for use as an abrasive grain for polishing is synthesized from gaseous phase by a process for the synthesis of granular diamond, comprising subjecting a mixed gas containing an organic compound and hydrogen to a treatment to form plasma and depositing diamond on substrate grains dispersed and fluidized in the resulting plasma space, characterized in that the substrate grains are dispersed and fluidized by the mixed gas fed at a flow rate of at least the terminal velocity of the grains and an AC or DC electric field is applied to a zone whose grain concentration in the space is in the range of 1 to 20% by volume.

6 Claims, 1 Drawing Sheet

PROCESS FOR THE SYNTHESIS OF GRANULAR DIAMOND

BACKGROUND OF THE INVENTION

1. Field of the Invention

This invention relates to a method synthesizing diamond in the vapor phase, by utilizing plasma and more particularly, it is concerned with a vapor phase synthesis of granular diamond suitable for use as an abrasive or grinding grains.

2. Description of the Prior Art

A vapor phase method of synthesizing diamond according to the prior art, by using plasma will now be illustrated by FIG. 2. Referring to FIG. 2, a in quartz tube 1 is arranged in microwave producing apparatus 5 and in this quartz tube 1 is arranged a support base 8 on which a plate-shaped substrate 7 is placed. As indicated by arrows, a mixed gas (raw material gas) of a volatile organic compound and hydrogen is subjected to microwave to form a plasma and diamond is deposited on the above described plate-shaped substrate 7 arranged in the plasma space.

However, the diamond synthesized in this way is film-shaped and can hardly be applied to articles which require granular shapes, for example, grinding grains. As is well known in the art, the vapor growth of granular diamonds is carried out by a method comprising dispersing and arranging substrate grains of diamond or silicon on the support base 8 instead of the plate-shaped substrate 7 as shown in FIG. 2 in which granular diamonds are grown from only the substrate grains. In this method, however, the number of the substrate grains to be dispersed and arranged is very small, that is, the number of granular diamonds obtained by one batch is so small that the production cost is increased and mass-production is difficult.

The reason why the number of the substrate grains to be arranged is small is that there is no way but to arrange them in two dimensions, that is, on only a certain plane. If the substrate grains can be arranged in three dimensions, that is, can be filled in a vessel, the number of the substrate grains is markedly increased. When the substrate grains are merely filled therein, however, there are small voids among the substrate grains, so a raw material gas does not form a plasma even if irradiated by microwaves. In order to render the raw material gas in the form of a plasma and thus deposit diamond on the substrate grains, it is required to provide voids at least in certain proportions among the substrate grains. Furthermore, it is apparent that even if a plasma is formed, the thus formed diamond is not in granular form.

Introduction of spaces or voids into among the substrate grains has, for example, been carried out by a method comprising arranging a vibration plate at the lower end of a packed layer of substrate grains and vibrating the vibration plate to disperse and float the substrate grains, as disclosed in Japanese Patent Publication No. 57568/1987. According to this method, however, there are formed both zones where the grains exist in a high concentration and zones where no grains exist and it is difficult to maintain a large amount of grains well dispersed therein.

In addition, there has been proposed a process for producing composite powdered grains, comprising feeding a mixed gas of $CH_4$ and $H_2$ under an excited state by a physical or chemical method and bringing it into contact with a powdered substrate in a CVD reaction apparatus. According to this process, however, it is also difficult to obtain a large amount of composite powdered grains in good quality.

SUMMARY OF THE INVENTION

It is an object of the present invention to provide a gaseous phase method of synthesizing diamond using a plasma.

It is another object of the present invention to provide a method of vapor growing granular diamond suitable for use as an abrasive grain for polishing.

These objects can be attained by a process for the synthesis of granular diamond, comprising subjecting a gaseous mixture containing an organic compound and hydrogen to an AC or DC electric field to form a plasma and depositing diamond on substrate grains dispersed and fluidized in the resulting plasma space, characterized in that the substrate grains are dispersed and fluidized by the gaseous mixture fed at a flow rate of at least the terminal velocity of the grains and the electric field is applied to a zone whose grain concentration is in the range of 1 to 20% by volume.

BRIEF DESCRIPTION OF THE DRAWINGS

The accompanying drawings illustrate in detail the principle and merits of the present invention.

DETAILED DESCRIPTION OF THE INVENTION

The inventors have made various studies on a method for effectively and simply introducing voids or spaces required for forming plasma among substrate grains filled in three dimensions even in the case of relatively large grains and consequently, have found that this can be achieved by application of the fluidized bed technique widely employed in the chemical industry. The present invention is based on this finding. The fluidized bed technique generally means a method wherein a reaction between a gas and grains is carried out by feeding the gas at a high flow rate from the bottom of a tube filled with the grains and thus dispersing and fluidizing the grains to bring them into close contact with each other.

Figure 1:
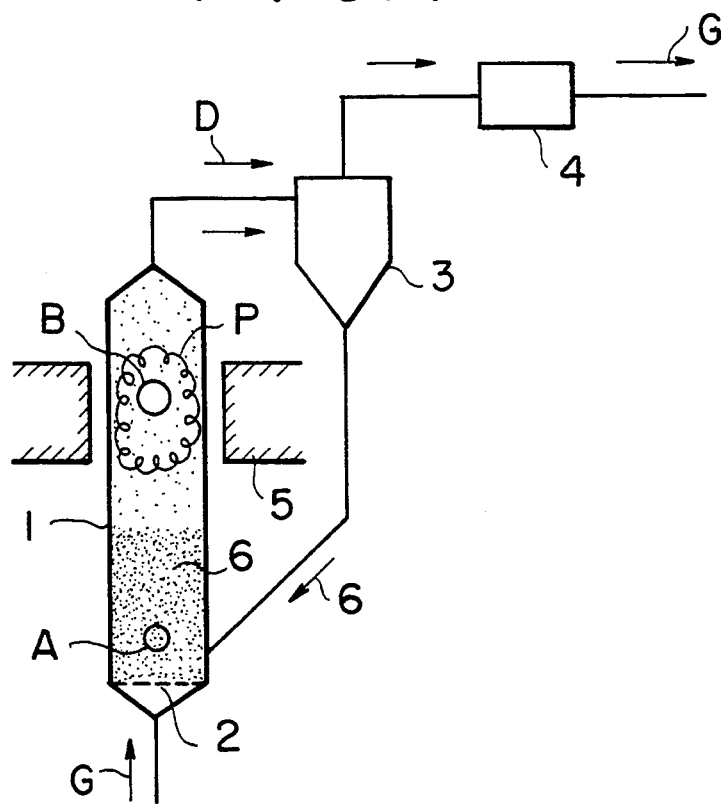
FIG. 1 is a schematic view of an apparatus for the practice of the process according to the present invention and FIG. 2 is a schematic view of an apparatus of the prior art.
Figure 2:
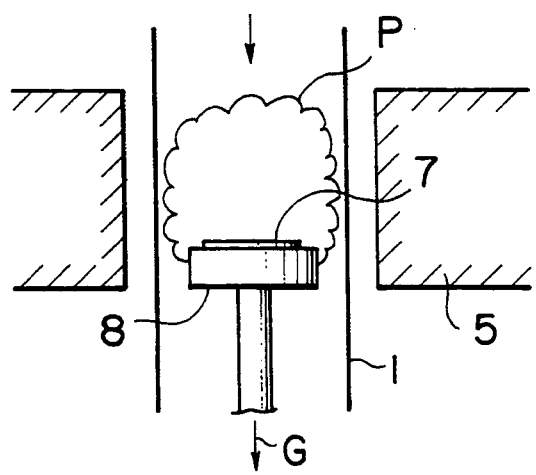

One preferred embodiment of the present invention will now be illustrated by the accompanying drawings:

In one preferred embodiment, as shown in FIG. 1, the process for the synthesis of granular diamond is carried out using a system comprising a quartz tube 1 for fluidizing and subjecting to plasma formation a raw material gas G and substrate grains 6, provided with a dispersing plate 2 at the bottom thereof, a microwave generating means 5 for forming plasma P, a pipe for feeding the raw material gas G, a pipe for discharging a dispersion D, a cyclone 3 for separating the substrate grains 6 from the dispersion and a pipe for recycling the substrate grains 6.

Referring to FIG. 1, a raw material gas G is fed in the direction shown by arrows to a quartz tube 1 packed with substrate grains 6 from the bottom thereof and brought into contact with substrate grain 6 through a dispersing plate 2. When the flow rate of the raw material gas is higher than a certain value called "minimum fluidization velocity", the weight of the grain and the drag of the gas acting on the grain are balanced and the grains are maintained by the gas to expand the grain layer. That is, the void ratio or porosity is increased. This expanded zone is shown by A in FIG. 1 and the zone A is generally called a "fluidized bed".

Firstly, when microwaves are applied to the zone A, there was no occurrence of plasma. This is due to that the void ratio of the zone A is only increased by 20 to 30% as compared with the packed layer and the grain concentration is still higher.

On the other hand, in the tube 1, there is a grain-diluted or smoke-like zone above the zone A, as shown by B. When microwave was applied to the zone B, there occurred a plasma sufficient to grow diamond. However, the grain concentration in the zone B is too dilute to maintain a high growth efficiency even if a diamond can be grown, and thus the synthesis of diamonds cannot be carried out on an economical basis.

In order to enhance this growth efficiency, it is necessary to increase the grain concentration in the zone B as far as possible within such a range as capable of generating a plasma. In a general fluidized bed, however, it is difficult to the grain concentration in the zone B. difficult.

According to the present invention, the above described problem is solved by feeding a gas at a sufficient flow rate to carry way the grains out of the tube, i.e., to give at least a terminal velocity thereto, thereby carrying away a part of the grains out of the tube, separating the thus entrained grains from the gas by means of a cyclone 3 and then recycling again the grains to the quartz tube 1. The terminal velocity is a constant value that the settling speed of a grain reaches finally when a single grain is added to a stationary fluid. Thus, when a fluid is flowed upward at a flow rate of more than the terminal velocity, the grain is entrained with the fluid and carried away from the system. This terminal velocity depends on the size, shape and density of a grain and the density and viscosity of a fluid, i.e., gas in this case.

The terminal velocity used in the present specification is defined by the following relationship:

$$v_t = \frac{g(\rho_p - \rho_f)}{18\mu} d_p^2 \quad (1)$$

wherein $v_t$=terminal velocity, g=gravitational acceleration, $\rho_p$=density of grain, $\rho_f$=density of gas, $d_p$=grain diameter, $\mu$=gaseous viscosity.

Since the general fluidized bed is operated in such a manner that grains are not carried away from a tube, control of the density of the zone B is impossible. On the other hand, the present invention is characterized by positively effecting the carrying-away of the grains to control the concentration thereof, i.e. the void ratio. The concentration of the zone B, depending upon the variety of a raw material gas and the pressure in the system, should be at most 20% by volume, preferably 5 to 15% by volume.

The present invention should be carried out with attention to the withdrawal of the grains in the tube and control of the flow rate of a raw material gas. That is, the grains gradually grow, the size of every grain, one by one, and the bulk of all the grains naturally increase, so it is required to withdraw the grains and control the gas flow rate correspondingly to the growth of the grains in order to maintain the grain concentration in the zone B under an optimum state.

As a means for generating plasma, an Ac or DC electric field can be used, but it is preferred to use microwaves or high frequency of 30 KHz to 50 GHz capable of generating plasma without inserting an electrode in a reactor, for example, a quartz tube. Preferably, microwaves of at least 300 MHz can be used and more preferably, a microwave of 2.45 GHz is used in view of industrial regulations.

As a raw material gas, any of gaseous materials generally used for the vapor growth of a diamond can be used independently of the variety and composition, but for the purpose of rapid growth of diamonds, it is preferable to use mixed gases of hydrogen gas, inert gases and gaseous organic compounds, as described in Japanese Patent Laid-Open Publication No. 22640/1988, for example, a mixed gas of $H_2$, Ar and $CH_4$ in a proportion by volume of 50:25:1, Since these gases are expensive and since large amounts of the gases are used in the present invention, it is preferred to provide the system of the present invention with a circulation installation for reusing the gas discharged from the cyclone as a part of the raw material gas.

As a substrate grain, there can be used any of materials which can be coated with diamond. When using diamond as the substrate grain, it is natural to obtain a crystal having most excellent crystalline properties and highest strength, but depending on the purpose of use, SiC, AlN, Si, etc. can be used.

As illustrated above, according to the present invention, a larger amount of granular diamond can be obtained by one batch as compared with the prior art, thus resulting in marked reduction of the production cost. Furthermore, a continuous operation, without stopping the installation, can be rendered possible by providing an additional apparatus for supplementing and discharging the grains in suitable manner. Therefore, synthesis of diamond abrasive grains from gaseous phase can be carried out on a commercial scale.

The following examples are given in order to illustrate the present invention in greater detail without limiting the same.

EXAMPLE 1

An apparatus as shown in FIG. 1 was used in which a quartz tube 1 having an inner diameter of 40 mm was packed with diamond powder having a mean grain diameter of 50 μm in a height of 40 mm. A mixed gas of $H_2$, Ar and $CH_4$ in a proportion by volume of 50:25:1 was fed to the lower part of the diamond packed layer at a flow rate of 4 SLM (standard liter per minute) at the initial period, the flow rate being increased with the growth of the grains, during which the pressure in the system was maintained at 50 Torr by a vacuum pump 4 connected with a cyclone 3, and the grains up to a height of 100 mm from a dispersing plate 2 were in a considerably thickened state with a grain concentration of 35% by volume, above which the upper grains were smoke-like and led to the cyclone 3.

Under this state, a microwave of a frequency of 2.45 GHz was applied to a zone with a height of 150 to 200 mm from the dispersing plate 2 and with an average grain concentration of 10% by volume at an output of 800 W for 50 hours, thus recovering all the diamond grains grown to a mean grain diameter of 75 μm.

With the progress of the reaction, the grain diameter was gradually increased to gradually lower the grain concentration in space, as apparent from the foregoing formula (1), so the grain concentration in space in the range of a height between 150 mm and 200 mm was controlled to 10% by volume by gradually increasing the flow rate.

EXAMPLE 2

An apparatus as shown in FIG. 1 was used in which a quartz tube having the diameter as that of Example 1 was packed with SiC grains having a mean grain diameter of 100 μm in a height of 60 mm. A mixed gas of $H_2$, Ar and $C_2H_5OH$ in a proportion by volume of 50:25:2 was fed to the quartz tube from the bottom thereof at a flow rate of 8 SLM, during which the pressure in the system was maintained at 40 Torr. A microwave of 1 KW and 2.45 GHz was applied in an analogous manner to Example 1 to a zone with a height of 200 to 250 mm from the dispersing plate 2 and having a grain concentration of 5% by volume, which was continued for 100 hours while withdrawing the grains in the system every 10 hours so that the total weight of the grains in the system be not so changed. Consequently, all the SiC grains were fully coated with diamond to give a grain diameter of about 200 μm.

What is claimed is:

1. In a process for the synthesis of granular diamond, comprising subjecting a mixed gas containing an organic compound and hydrogen to a treatment to form plasma in a reaction zone and depositing diamond on substrate grains dispersed and fluidized in the resulting plasma space, the improvement wherein the substrate grains are dispersed and fluidized by the mixed gas fed at a flow rate of at least the terminal velocity of the grains and an electric field is applied to a zone whose grain concentration in the space is in the range of 1 to 20% by volume to deposit diamond on the substrate grains, providing a cyclone separately from reaction zone to separate the entrained grains from the fluidized gas and recycling the substrate grains to the reaction zone, said terminal velocity being a constant value that the settling speed of a grain finally reaches when a single grain is added to a stationary fluid defined by the following relationship:

$$v_t = \frac{g(\rho_p - \rho_f)}{18\mu} d_p^2 \quad (1)$$

wherein $V_t$=terminal velocity, g=gravitational acceleration, $P_p$=density of grain, $P_f$=density of gas, $d_p$=grain diameter and $\mu$=gaseous viscosity.

2. The process as claimed in claim 1, wherein the electric field is generated by the use of microwaves at a frequency of at least 300 MHz.

3. The process as claimed in claim 1, wherein the mixed gas contains hydrogen gas, an inert gas and an organic compound.

4. The process as claimed in claim 3, wherein the mixed gas contains $H_2$, Ar and $CH_4$.

5. The process as claimed in claim 1, wherein the substrate grains are selected from the group consisting of diamond, SiC, AlN and Si powders.

6. The process as claimed in claim 1, wherein the depositing of diamond is carried out in a system comprising a quartz tube provided with a dispersing plate at the bottom thereof, a microwave generating means, a pipe for feeding a raw material gas, a pipe for discharging a dispersion, a cyclone for separating substrate grains from the dispersion and a pipe for recycling the substrate grains.

* * * * *